April 28, 1964 W. C. DERSCH 3,131,362
BALANCED TRANSISTOR MULTIVIBRATOR
Filed May 31, 1960 2 Sheets-Sheet 1

*INVENTOR.*
WILLIAM C. DERSCH
*BY*
Fraser and Bogucki

*INVENTOR.*
WILLIAM C. DERSCH
*BY*
Fraser and Bogucki 3,131,362

BALANCED TRANSISTOR MULTIVIBRATOR

William C. Dersch, Los Gatos, Calif., assignor to International Business Machines Corporation, New York, N.Y., a corporation of New York Filed May 31, 1960, Ser. No. 32,745
7 Claims. (Cl. 331—60)

This invention relates to semiconductor multivibrator circuits and more particularly to improvements in multivibrator circuits of the type which utilize a pair of semiconductor devices of opposite conductivity type connected in a complementary manner to provide symmetry of operation.

Semiconductor multivibrators of the type which utilize a pair of opposite conductivity type transistors connected in a complementary manner are characterized by their potentialities for low conduction duty cycles and symmetrical characteristics. A complementary symmetry circuit combines a pair of transistors of opposite conductivity type which mutually counteract each other's lack of stability due to the nonlinear compensation of one transistor by the other. A pair of complementary transistors having their emitters joined or coupled to ground are coupled with associated circuitry to provide multivibrator operation. Unlike conventional multivibrators whose transistors alternately conduct, necessitatting a high conduction duty cycle, both complementary transistors simultaneously maintain like operating states of conduction throughout the entire operation, providing a lower duty cycle if desired. The well known symmetrical conducting characteristics of complementary connected transistors are particularly advantageous in multivibrator circuits, providing more stable and efficient circuit operation than prior multivibrators.

In any multivibrator circuit effiicency and stability particularly depend upon the ability to compensate for inherent errors in transistors. While the connection of a pair of transistors in a complementary manner, as described in the patent to Lohman, No. 2,769,907, compensates for some errors which are due to changing transistor parameters, other errors are introduced from associated circuitry. A single capacitive coupling circuit which controls the switching of the complementary connected transistors between operating states of conduction provides an inherently unbalanced circuit, thus limiting efficiency and stability. Further, due to the unbalanced coupling circuit, the accuracy and variety of signal outputs is limited. The pulse width of the output signal is dependent on circuit parameters, including the amplitude of the input triggering signal, which markedly limits accuracy.

An increasing use for multivibrators of the free-running and monostable types is found in data processing systems, particularly those which are concerned with automatic recognition of speech and other manifestations of intelligence. Such systems may utilize multivibrators to generate pulses for frequency analysis of spoken manifestations. The circuits heretofore available, however, have been of limited stability except in relatively narrow frequency bands, and have not been sufficiently reliable for speech recognition installations.

Accordingly, it is one object of the invention to provide an improved semiconductor multivibrator.

It is another object of this invention to provide a balanced multivibrator producing a plurality of outputs independent of circuit parameters.

It is still another object of this invention to provide a multivibrator connected in a balanced arrangement to provide stable and efficient operation.

It is a still further object of this invention to provide a balanced multivibrator which operates in response to selected points or inflections of an alternating current waveform to provide pulses of timed duration.

Briefly, in accordance with features of the invention, there is provided a pair of transistors of opposite conductivity type connected in complementary fashion to provide a free running multivibrator. A pair of capacitive circuits couple the collector of each transistor to the base of the other to maintain both transistors in the same operating state throughout each cycle of operation. The bases of both transistors are self-biasing in that they are maintained floating, i.e. free of direct current bias except that provided through other elements. Output signals of opposite polarity and predetermined amplitude ratio are obtained from the collectors of the transistors.

In accordance with further features of the invention, means are provided for applying a synchronizing signal to the bases of the transistors to control the operation of the multivibrator. Selected inflection points of the synchronizing signals trigger the multivibrator, which provides a uniform pulse for use in data processing such as speech recognition applications.

A better understanding of the invention may be had from the following detailed description taken in conjunction with the drawing, in which.

Figure 1:
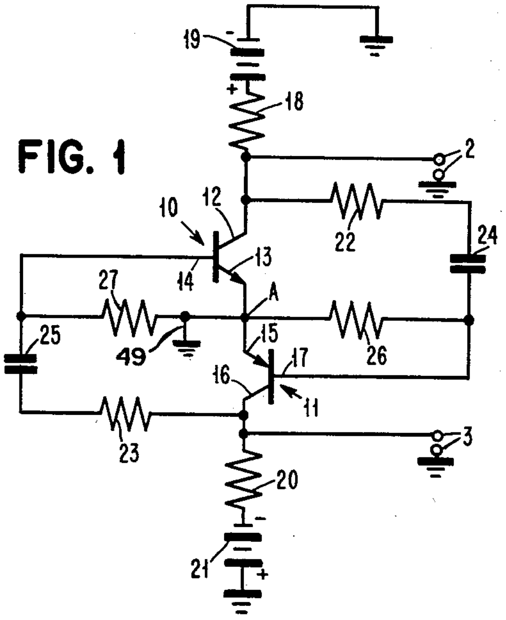
FIG. 1 is a schematic circuit diagram illustrating a free running multivibrator embodying the principles of the invention.

Referring to FIG. 1 of the drawing, an astable or free running multivibrator includes a pair of opposite conductivity, complementary, first and second transistors 10 and 11. Each of the transistors 10 and 11 has a current receiving, a current emitting, and a control electrode, with the first transistor 10 being of the N-P-N type and the second transistor 11 being of the P-N-P type. In the first transistor 10 the current receiving electrode is a collector 12, the current emitting electrode is an emitter 13, and the control electrode is a base 14. In the second transistor 11 the current receiving electrode is an emitter 15, the current emitting electrode is a collector 16, and the control electrode is a base 17. The collector 12 is connected through a load resistor 18 to the positive terminal of a direct current source 19. The collector 16 is connected through a load resistor 20 to the negative terminal of a direct current source 21. The emitter 13 of the first transistor 10 is connected in common with the emitter 15 of the second transistor 11 to a junction point A which serves as a signal reference point. A resistor 26 is connected between the base 17 of the second transistor 11 and the junction point A, and a resistor 27 is connected between the base 14 of the first transistor 10 and the junction point A.

A resistor 22 is connected in series with a capacitor 24 between the collector 12 and the base 17 to provide a coupling circuit between the first transistor 10 and the second transistor 11. A different resistor 23 is connected in series with a capacitor 25 to provide a coupling circuit between the collector 16 of the second transistor 11 and the base 14 of the first transistor 10. Separate signal outputs are provided by a pair of terminals 2 connected between the collector 12 and ground and by another pair of terminals 3 connected between the collector 16 and ground. The bases 14 of the transistors are thus floating, or free of direct current bias except that provided through the associated elements.

In operation, the transistors 10 and 11 alternate in free running fashion between the conductive and nonconductive states of operation, with both transistors 10 and 11 being conductive or nonconductive at the same time. Because of the alternation of states this may properly be spoken of as a multivibrator action, even though there is not a "flip-flop" relation between the transistor elements. Assuming at a given instance that the transistors 10 and 11 are nonconductive and that the capacitors 24 and 25 are discharged, a charging current immediately flows in a first path comprising the positive terminal of the source 19, the resistor 18, the resistor 22, the capacitor 24, the resistor 26, the resistor 27, the capacitor 25, the resistor 23, the resistor 20 and the negative terminal of the source 21. Current passing through the resistor 26 produces a voltage drop across the resistor 26, thus biasing the base 17 of the second transistor 11 positive with respect to the emitter 15, maintaining the P-N-P type second transistor 11 nonconductive. Also, the same charging current passing through the resistor 27 produces a voltage drop therein biasing the base 14 of the first transistor 10 negative with respect to the emitter 13, maintaining the transistor 10 nonconductive.

As the capacitors 24 and 25 become charged, however, the charging current decreases, biasing the base 17 of the second transistor 11 less positive, so that the base 17 goes negative as the base 14 of the first transistor 10 conversely goes less negative. As the biases on the first and second transistors 10 and 11 are changed, levels are ultimately reached at which the bases of the transistors 10 and 11 are properly biased for conduction, so that both transistors 10 and 11 start to change from the nonconductive state to the conductive state.

In addition to the action described above, the coupling provided by the circuits including the capacitors 24 and 25 operates in a balanced manner to maintain both the transistors 10 and 11 in the same operating state. When the biases on the transistors 10 and 11 reach points where conduction commences, the collector 16 of the second transistor 10 goes positive a small amount as the collector 12 of the first transistor 10 goes negative a small amount. While one of these changes may slightly precede the other this is immaterial inasmuch as there is a cumulative effect. Starting with the second transistor 11, the positive change at the collector 16 is coupled through the resistor 23 and the capacitor 25 to the base 14. A positive signal on the base 14 tends to increase conduction in the first transistor 10 with the collector 12 going negative. The negative change on the collector 12 is coupled through the resistor 22 and the capacitor 24 to the base 17, further increasing the conduction in the transistor 11.

Thus, it may be seen that the capacitive coupling circuits between the collector 16 and the base 14 and between the collector 12 and the base 17 operate to provide positive feedback signals between the first and second transistors 10 and 11. Because the feedback signals are in phase, i.e., the signal from the collector 16 to the base 14 tends to increase conduction in the transistor 10 as the signal from the collector 12 to the base 17 tends to increase conduction in the transistor 11, the operating states of the transistors 10 and 11 rapidly change from nonconduction to conduction. Because the charging paths of the capacitors 24 and 25 are in series, it is not necessary to match their values. The provision of a pair of coupling circuits therefore provides a balanced operation.

Continuing with the operation, when the transistors 10 and 11 have reached the conductive state, the potentials at the collector 12 and the collector 16 are nearly the same, and substantially equal to the potential of the common junction A which is coupled to the emitters 13 and 15, due to the low impedance characteristics of the conducting transistors 10 and 11. As soon as the transistors 10 and 11 reach their conductive state, however, the capacitors 24 and 25 begin to discharge. As the potentials of all of the transistor elements are nearly equal in this condition of operation, the discharging path of the capacitor 24 is through the resistor 22 and the low impedance circuit including the transistors 10 and 11. In the same manner, the discharging path of the capacitor 25 is through the resistor 23. As the capacitors 24 and 25 discharge, the potentials at the bases 14 and 17 shift to levels at which the collector 16 of the second transistor 11 tends to go negative, and the collector 12 of the first transistor 10 tends to go positive, so that both the first and second transistors 10 and 11 are tending toward nonconduction, which state is quickly achieved. The couplings provided by the circuits which include the capacitors 24 and 25 thus again operate to provide inphase feedback between the collector 12 and the base 17 and the collector 16 and the base 14, so as to drive both the transistors 10 and 11 into the nonconductive state of operation. Once both the transistors 10 and 11 are nonconducting, the collector 12 rises rapidly toward the positive potential of the source 19 and the collector 16 falls rapidly toward the negative potential of the source 21. Thus the circuit is again returned to the original state, with the transistors 10 and 11 once again being nonconductive. Thereafter, the operation is repeated, with both of the transistors 10 and 11 simultaneously switching between the nonconductive and conductive states.

The output signals derived from the circuit are taken at the terminals 2, representing the potential between the collector 12 and ground, and between the terminals 3, representing the potential between the collector 16 and ground. The output signals at each of the two terminals 2 and 3 are of opposite polarity with respect to each other. During the conductive operating state, the signals at the terminals 2 and 3 are both substantially equal to the potential level at the junction point A, which in this configuration is approximately at ground potential. During the nonconductive operating state, the positive signal at the terminal 2 and the negative signal at the terminal 3 are at levels determined principally by the potentials of the sources 19 and 21.

This free running multivibrator has improved stability over devices heretofore available. The balanced arrangement is essentially free of the circuit parameters of the transistor, so that a number of different types of readily available transistors may be used. Because both transistors conductor simultaneously, they may be made to conduct, by adjustment of the bias levels, for intervals much shorter than the intervals of nonconduction. For pulses of several microseconds duration, for example, the ratio of the conducting to the nonconducting interval may be of the order of 1 to 1000. This low duty cycle arrangement further enhances system stability, as well as reducing current drain. The transistors need not be closely matched. Instead, the faster characteristics of one transistor will control to provide high speed operation despite the presence of a slower transistor. While turn on times may be susbtantially constant, for example, there may be wide differences in turn off times. Because the transistors conduct relatively equally in this arrangement, the turn off time of the faster transistor controls.

The foregoing description applies even if the signal junction A is not actually coupled to a stable ground potential. However, the circuit may employ an actual signal ground connection 49 at junction A to provide similar performance with slightly faster rise and fall times. Rise and fall times may also be increased by deletion of the resistors 22 and 23.

Figure 2:
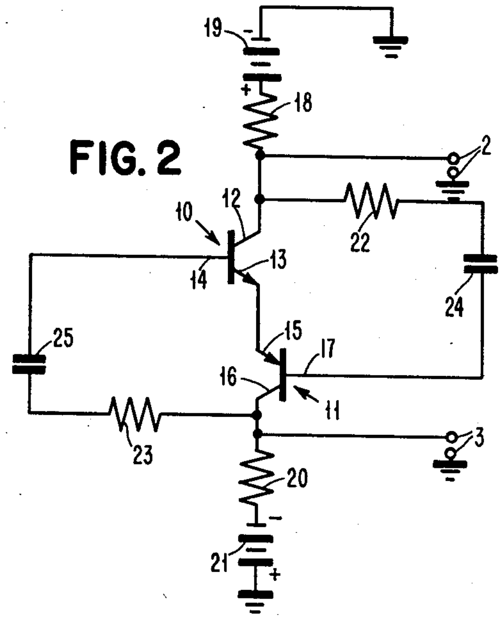
FIG. 2 is a schematic circuit diagram of a different form of free running multivibrator in accordance with the invention.

In another form of this circuit, illustrated in FIG. 2, the resistor 26 and 27 may be omitted, so that base-collector leakage currents are used to control the charging times of the capacitors 24 and 25. In such arrangements the charging paths for the capacitors 24 and 25 are completed through the base-collector network 17, 16, and 14, 12 respectively, which appear as resistances in the circuit. When the transistors conduct, for example, the emitters 13 and 15 and the collectors 12 and 16 are essentially at signal ground. The bases 14 and 17 tend to assume the same potential through the leakage at the base-collector junction. Because the leakage resistances are highly temperature dependent, the discharge times of the capacitors 24 and 25 vary the period of the multivibrator accordingly. Such circuits may be used to provide temperature indications or temperature compensation for systems which require temperature stabilization.

The balanced circuits of FIGS. 1 and 2 may also be operated, particularly for speech recognition applications, so as to be triggered by one or more characteristic inflection points of a synchronizing signal. One such circuit is shown in detail in FIG. 3. The synchronizing signal may be applied from a pair of terminals 1 to the base 14 of the first transistor 10 through a resistor 29, and also to the base 17 of the second transistor 11 through a resistor 28 which is in parallel with the resistor 29. The synchronizing signal applied to the terminals 1 alternates about a base level in some manner, but need not be of sinusoidal form. An audio waveform may be employed, for example.

In analyzing signals which represent spoken words, pitch or frequency information is extremely useful. One effective frequency analysis technique counts the "zero crossings" which occur in time varying electrical signals which represent different words. While the term "zero crossings" usually refers to those positive-going and negative-going inflection points at which an alternating signal passes through its median value, the term may also be applied to other characteristic points, such as the maxima and minima of an alternating current signal. In carrying out such frequency analyses, it is often useful to employ a circuit, such as a pulse generator, which supplies a pulse of uniform duration for each of the selected points of the waveform. Successive uniform pulses derived from an audio waveform may be integrated over a period of time to provide an indication of the average pitch or frequency of the audio signal.

Figure 3:
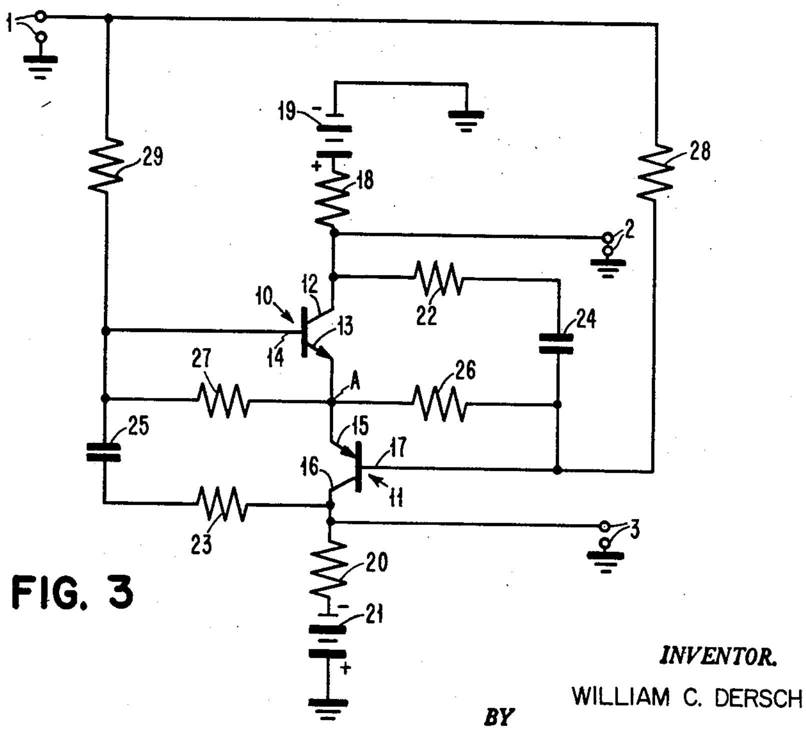
FIG. 3 is a schematic circuit diagram of a multivibrator arranged to be controlled by synchronizing signals.

The circuit shown in FIG. 3 has particularly good stability and versatility when used with the conditions typically encountered in speech recognition applications. Heretofore, the frequency of the signal which is applied has had a marked effect upon the voltage levels required to trigger a pulse generator device. In addition, circuits heretofore available have required fairly precise triggering voltages. The triggering pulses provided by audio waveforms vary widely in both frequency and amplitude, so that the prior circuits have not been fully satisfactory for use in frequency analysis.

In the operation of the circuit of FIG. 3, synchronizing signals of sinusoidal form, but not necessarily of a fixed frequency, as shown by waveform 30 in FIG. 7, are applied at the synchronizing input terminals 1 to trigger the circuit by application of the signal voltage to the bases 14 and 17 through the resistors 28 and 29. The circuit of FIG. 3 is arranged to become unstable (conducting) whenever the applied voltage levels shift through a zero crossing at the signal ground level. Both positive-going and negative-going inflections will cause the circuit to trigger.

While this operation may be expressed in terms of the levels of the biases applied to the bases 14 and 17 of the transistors 10 and 11, such explanation is not adequate when applied to other circuits in accordance with the invention. The factors which affect the operation are apparently complex, but it does appear that the voltages of the base-emitter networks may be shifted considerably, relative to the collectors, without overpowering the circuit. An initial input bias, such as at the positive-going zero crossing 30(*a*) in FIG. 4, will operate at the base 14 of the first transistor 10 to drive the circuit into conduction. The in-phase feedback between the transistors 10 and 11 almost instantaneously causes the second transistor 11 to begin conducting. Both transistors 10 and 11 conduct, for an interval determined by the time constants of the circuit. The base-emitter networks shift together to new voltage levels, and are unaffected by the changes at the collector when conduction ceases. It is known that circuits in accordance with the invention will not retrigger if the synchronizing signal remains of the same polarity for longer than the natural period of the multivibrator. When the relative levels are against shifted back, however, as at the next negative-going zero crossing, 30(*b*) in FIG. 4, the circuit again triggers. This action, of shifting into conduction for the selected conducting interval, is repeated for each succeeding zero crossing.

The circuit therefore provides a positive pulse for each trigger point at terminal 2 and a negative pulse for each trigger point at terminal 3. These current pulses of opposite polarity are indicated by the waveforms ) and 33 in FIG. 4. A low conduction duty cycle is again utilized, as shown in FIG. 4, with the transistors 10 and 11 being nonconductive during most of each cycle of operation.

Figure 4:
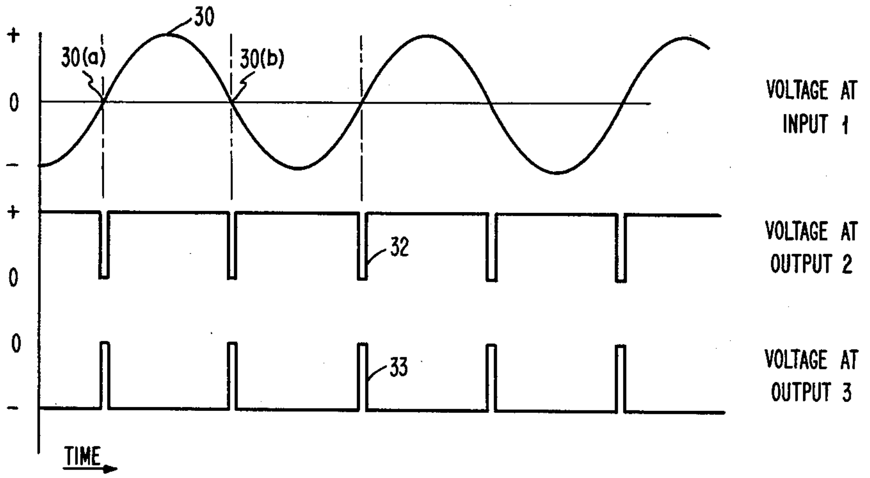
FIG. 4 is a graph illustrating waveforms of signals applied to the input terminals and derived from the output terminals of the circuit of FIG. 3.

The circuit stability of the arrangement of FIG. 4 is largely independent of the parameters of the transistors 10 and 11, such as speed of response. This stability is due both to the complementary operation of the transistors and the balanced coupling connections between the transistors, and is enhanced because of the low duty cycle. The time constants determined by the values of the resistors 22, 23, 26 and 27 and the capacitors 24 and 25 determine the pulse width ratios of the output signals as well as the natural frequency of the multivibrator. The values of the resistors 18 and 20 may further be proportioned so as to provide a desired amplitude ratio between the output signals at the terminals 2 and 3. The frequency of operation of the circuit in providing trigger pulses may be widely varied, when controlled by synchronizing signals applied from the terminal 1. In the arrangement shown in FIG. 2, synchronizing signals of just above the natural frequency of the multivibrator to more than three times the natural frequency were found desirable.

If desired, circuit values may be selected so as to provide other well known types of multivibrator action. A monostable multivibrator may be provided by selecting the values of the capacitors 24 and 25 and the series resistors 22 and 23, and by omitting one of the resistors 28 or 29, so that in the absence of a synchronizing signal from the input terminals 1 the transistors 10 and 11 have base biases which make the transistors normally conducting or nonconducting. The monostable multivibrator circuit may also be employed in systems using zero crossing frequency counters for voice wave shapes.

Figure 5:
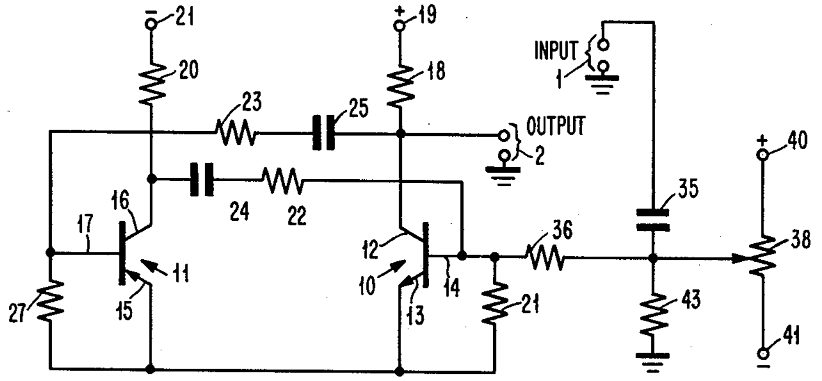
FIG. 5 is a schematic circuit diagram of a multivibrator pulse generator arranged in accordance with the invention.

The synchronized circuit may also be so arranged, as shown in the preferred arrangement illustrated in FIG. 5, as to be triggered only at particular signal maxima, such as positive peaks. In FIG. 5, the elements are numbered to correspond to like elements shown in FIGS. 1 and 2. In addition, input signals at the input terminal 1 are applied to the base 14 of the first transistor 10 through a coupling capacitor 35 and a limiting resistor 36. The base 14 of the first transistor 10 is normally maintained negative through adjustment of the contact of a variable resistor 38 which is coupled between a positive voltage supply 40 and a negative voltage supply 41. An additional resistor 43 couples the contact to ground.

Figure 6:
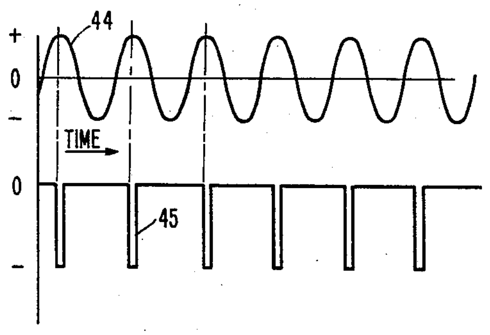
FIG. 6 is a graph illustrating various waveforms useful in explaining the operation of the arrangement of FIG. 5.

The operation of the circuit of FIG. 5 again appears to depend upon the shifting of the voltages of the base-emitter circuits by the triggering of the circuit and the applied synchronizing signal. As shown by waveform 45 in FIG. 6, the transistors 10 and 11 are triggered into conduction only by successive positive peaks in the synchronizing signal waveform 44. Once having triggered and returned to their nonconducting state, the transistors 10 and 11 remain biased to nonconduction until again triggered by the next positive peak of the applied input signal. The triggering action produces the waveform 45 of FIG. 6, and has been found to operate stably over a range of 850 to 7150 c.p.s., for a circuit constructed with values as given below. It has also been found that there is a high measure of independence from critical triggering voltages, making the circuit eminently satisfactory for speech recognition work.

One arrangement of a system in accordance with the invention provided satisfactory operation with the following element values in a combination corresponding to the circuit of FIG. 3:

| | |
|---|---|
| Transistor 10 | N-P-N junction type 2N214. |
| Transistor 11 | P-N-P junction type 2N247. |
| Capacitors 24, 25 | .001 microfarad. |
| Resistors 22, 23 | 5.1 kilohms. |
| Resistors 18, 20 | 10 kilohms. |
| Resistors 26, 27 | 47 kilohms. |
| Resistors 28, 29 | 100 kilohms. |
| D.C. sources 19, 21 | A single D.C. source having terminals of plus 22 volts, ground and minus 22 volts. |

Another circuit, arranged in accordance with FIG. 5, employed the following circuit values:

| | |
|---|---|
| Transistor 10 | N-P-N junction type 2N1306 or 2N35. |
| Transistor 11 | P-N-P junction type 2N1307. |
| Capacitors 24, 25 | .01 microfarad. |
| Resistors 22, 23 | 5.1 kilohms. |
| Resistors 26, 27 | 47 kilohms. |
| Resistor 36 | 100 kilohms. |
| Resistor 43 | 10 kilohms. |
| D.C. sources 19, 40 and 21 and 41 | Plus 12 and minus 12 volts. |

It will be recognized that the circuit may also utilize a number of modifications. The transistors 10 and 11 may be either of the N-P-N type and P-N-P type respectively, as shown, or of opposite conductivity types with changes in the polarity of the coupled direct current sources.

While arrangements in accordance with the invention have been shown and described, it will be appreciated that various other alternatives and modifications may be employed. Accordingly, the invention should be considered to include all modifications and variations falling within the scope of the appended claims.

What is claimed is:

1. A pulse generator comprising a pair of semi-conductor devices of opposite conductivity type, each having operating states of conduction and nonconduction, each of said devices having current receiving, current emitting, and control electrodes, a source of direct current having positive, ground, and negative terminals, means for connecting the positive terminal of said source to the means for connecting the negative terminal of said source current receiving electrode of the first of said devices, to the current emitting electrode of the second of said devices, the current emitting electrode of the first of said devices and the current receiving electrode of the second of said devices being connected in common to the ground terminal of said source, the control electrode circuits of said devices being self-biasing, first capacitor means for coupling the current receiving electrode of the first of said devices to the control electrode of the second of said devices, and second capacitor means for coupling the current emitting electrode of said second device to the control electrode of said first device.

2. The device of claim 1 wherein is included a pair of signal output means respectively connected to the current receiving electrode of said first device and the current emitting electrode of said second device for receiving signals of opposite polarity.

3. The device of claim 1 wherein is included means for applying a bias to the control electrodes of said devices to control the frequency of said pulse generator.

4. A multivibrator pulse generator including the combination of a pair of transistors of opposite conductivity types, each of the transistors having a collector, base and emitter electrode, a first capacitive charging circuit including a series resistor and capacitor coupling the collector of the first of said transistors to the base of the second of said transistors, a second capacitive charging circuit including a series resistor and capacitor coupling the collector of the second transistor to the base of the first transistor, direct current source means coupled to the collectors of the transistors, means providing a common conductor coupled to the emitters of the transistors, means including resistor means coupling the bases of the transistors to the common connector, the base circuits of the transistors being self-biasing, and means including a pair of resistive elements coupled to the bases of the transistors for applying synchronizing signals to trigger the transistors substantially concurrently into a like conductive state.

5. A pulse generator including the combination of a pair of transistors of opposite conductivity type, each of the transistors having collector, base and emitter electrodes, means coupling the emitters of the transistors to a common conductor, a pair of capacitive charging circuits, each coupling the collector of a different one of the transistors to the base of the other of the transistors, means coupled to the collectors of the transistors and to the capacitive charging circuits for providing direct current bias thereof, the base electrode circuits of the transistors being self-biasing as to conduction of the transistors, and means coupled to the base of one of the transistors for providing a synchronizing signal therto to initiate conduction in the transistors, the last named means including biasing means for maintaining the associated transistor normally non-conducting in the absence of selected points of the synchronizing signal.

6. In a pulse generator circuit the combination comprising a pair of transistors of opposite conductivity type, each having operating states of conduction and nonconduction, each of said transistors having collector, base, and emitter electrodes, a first circuit comprising a resistor and capacitor connected in series for coupling the collector of the first of said transistors to the base of the second of said transistors to maintain said second transistor in the same operating state as said first transistor, a second circuit comprising a resistor and capacitor connected in series for coupling the collector of said second transistor to the base of said first transistor to maintain said first transistor in the same operating state as said second transistor, a source of direct current having positive, ground, and negative terminals, a first load resistor connected between said positive terminal and the collector of said first transistor, a second load resistor connected between said negative terminal and the collector of said second transistor, the emitters of said transistors being connected in common to said ground terminal, the base circuits of said transistors being self-biasing, first signal output means having a pair of terminals connected between the collector of said first transistor and ground, second signal output means having a pair of terminals connected between the collector of said second transistor and ground, the signals received at said first signal output means being of opposite polarity with respect to the signals received at said second signal output means.

7. The device of claim 6 wherein is included signal input means having a pair of terminals, one of said terminals connected to ground, and impedance means for connecting the other of said terminals to the bases of said transistors, said signal input means being adapted to receive a signal for controlling the frequency of said pulse generator.

References Cited in the file of this patent

UNITED STATES PATENTS

| | | |
|---|---|---|
| 2,605,306 | Eberhard | July 29, 1952 |
| 2,831,113 | Weller | Apr. 15, 1958 |
| 2,956,241 | Huang | Oct. 11, 1960 |

UNITED STATES PATENT OFFICE
CERTIFICATE OF CORRECTION

Patent No. 3,131,362 April 28, 1964

William C. Dersch

It is hereby certified that error appears in the above numbered patent requiring correction and that the said Letters Patent should read as corrected below.

Column 1, line 27, for "necessitatting" read -- necessitating --; column 4, line 66, for "conductor" read -- conduct --; column 5, line 74, for "FIG. 7" read -- FIG. 4 --; column 6, line 38, strike out the closing parenthesis and insert instead -- 32 --; column 8, line 1, strike out "means for connecting the negative terminal of said source" and insert the same after "devices," in line 2, same column 8; line 53, for "therto" read -- thereto --.

Signed and sealed this 8th day of September 1964.

(SEAL)
Attest:

ERNEST W. SWIDER
Attesting Officer

EDWARD J. BRENNER
Commissioner of Patents